(12) United States Patent
Hsieh

(10) Patent No.: US 11,516,937 B1
(45) Date of Patent: Nov. 29, 2022

(54) HEAT DISSIPATION MODULE AND DYNAMIC RANDOM ACCESS MEMORY DEVICE

(71) Applicant: GOLDEN EMPEROR INTERNATIONAL LTD., New Taipei (TW)

(72) Inventor: Chieh-Hung Hsieh, Taipei (TW)

(73) Assignee: GOLDEN EMPEROR INTERNATIONAL LTD., New Taipei (TW)

(*) Notice: Subject to any disclaimer, the term of this patent is extended or adjusted under 35 U.S.C. 154(b) by 7 days.

(21) Appl. No.: 17/382,359

(22) Filed: Jul. 22, 2021

(30) Foreign Application Priority Data

May 13, 2021 (TW) ................................ 110205398

(51) Int. Cl.
*H05K 7/20* (2006.01)

(52) U.S. Cl.
CPC ...... *H05K 7/20172* (2013.01); *H05K 7/20145* (2013.01)

(58) Field of Classification Search
CPC ...... G06F 1/20; G06F 2200/201; G06F 1/185; G06F 1/206; G06F 13/409; H01L 23/3672; H01L 23/4093; H01L 23/367; H01L 23/467; H01L 21/4882; H05K 7/20509; H05K 7/2039; H05K 2201/10159; H05K 1/0203; H05K 1/181; H05K 5/0021; H05K 7/20136; H05K 1/141; H05K 2201/066; H05K 7/2049; F28D 2021/0029; G11C 5/04

USPC ........ 361/704, 715, 716, 721, 719, 679.31, 361/679.54, 688, 690, 695, 709, 728; 165/104.33; 257/23.103, 719
See application file for complete search history.

(56) References Cited

U.S. PATENT DOCUMENTS

| | | | | |
|---|---|---|---|---|
| 7,151,668 B1* | 12/2006 | Stathakis | .............. | H01L 23/473 257/E23.098 |
| 7,400,506 B2* | 7/2008 | Hoss | .................... | H01L 23/4093 174/16.3 |
| 7,447,024 B1* | 11/2008 | Chou | .................... | H01L 23/467 165/122 |
| 7,579,687 B2* | 8/2009 | Szewerenko | ........ | H05K 1/0256 257/E23.008 |
| 2009/0303679 A1* | 12/2009 | Chen | ........................ | G06F 1/20 361/679.49 |

(Continued)

*Primary Examiner* — Mandeep S Buttar
(74) *Attorney, Agent, or Firm* — Li & Cai Intellectual Property Office

(57) ABSTRACT

A heat dissipation module and a dynamic random access memory device are provided. The heat dissipation module includes a main body, a fan, and an electrical connection component. The main body is fixedly disposed on a substrate of a memory component that includes a dynamic random access memory. The main body includes a receiving through-hole, a plurality of guide through-holes, and a plurality of exhaust through-holes. The fan is fixedly disposed on the main body and configured to allow air outside the substrate to enter the substrate through the receiving through-hole and the guide through-holes, and the air entering the substrate through the receiving through-hole and the guide through-holes is discharged outwardly through the exhaust through-holes. The electrical connection component is configured for an external power supply module to supply power to the fan.

6 Claims, 5 Drawing Sheets

(56) References Cited

U.S. PATENT DOCUMENTS

| | | | | |
|---|---|---|---|---|
| 2009/0316352 A1* | 12/2009 | Zhu | .................. | H05K 7/2049 |
| | | | | 361/679.54 |
| 2010/0008034 A1* | 1/2010 | Hinkle | ................ | H05K 1/189 |
| | | | | 361/679.31 |
| 2011/0228476 A1* | 9/2011 | Lin | ................ | H05K 7/20172 |
| | | | | 361/695 |
| 2011/0310565 A1* | 12/2011 | He | .................. | H01L 23/4093 |
| | | | | 361/715 |
| 2013/0163174 A1* | 6/2013 | He | ........................ | G06F 1/20 |
| | | | | 361/679.32 |

\* cited by examiner

HEAT DISSIPATION MODULE AND DYNAMIC RANDOM ACCESS MEMORY DEVICE

CROSS-REFERENCE TO RELATED PATENT APPLICATION

This application claims the benefit of priority to Taiwan Patent Application No. 110205398, filed on May 13, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a heat dissipation module and a memory device, and more particularly to a heat dissipation module and a dynamic random access memory device for installing in a memory component including a plurality of dynamic random access memories.

BACKGROUND OF THE DISCLOSURE

Currently, a heat dissipation method for DDR2, DDR3, and DDR4 memory modules is to attach a metal component with high thermal conductivity to a surface of the memory module. Heat generated during operation of the memory module is transferred outwardly through the metal component, so as to achieve a heat dissipation effect.

DDR5 memory modules are next-generation memory modules, and the heat generated by such a memory module is significantly higher than that of the traditional DDR2, DDR3, and DDR4 memory modules. When the conventional heat dissipation method is adopted for dissipating heat from the operating DDR5 memory module, problems such as frequency reduction or thermal shutdown of the DDR5 memory module may easily occur.

SUMMARY OF THE DISCLOSURE

In response to the above-referenced technical inadequacies, the present disclosure provides a heat dissipation module and a dynamic random access memory device, which are mainly used for overcoming problems caused by application of a conventional heat dissipation method in a DDR5 memory module (e.g., thermal shutdown of the DDR5 memory module).

In one aspect, the present disclosure provides a heat dissipation module, which includes a main body, a fan, and an electrical connection component. The main body is fixedly disposed on a substrate of a memory component, and the substrate includes a plurality of dynamic random access memories. The main body includes at least one receiving through-hole, a plurality of guide through-holes, and a plurality of exhaust through-holes. The at least one receiving through-hole penetrates through the main body and is located on one side of the main body. Each of the guide through-holes penetrates through the main body, the guide through-holes are disposed adjacent to the at least one receiving through-hole and are disposed on one side surface of the main body. The exhaust through-holes penetrate through the main body and are located on a narrow side of the main body. The fan is fixedly disposed on the main body and correspondingly located in the at least one receiving through-hole. The fan is configured to allow air outside the substrate to enter the substrate through the at least one receiving through-hole and the guide through-holes, and the air entering the substrate through the at least one receiving through-hole and the guide through-holes is discharged outwardly through the exhaust through-holes. The electrical connection component is electrically connected to the fan. The electrical connection component is electrically connected to an external power supply module, so that the external power supply module supplies power to the fan.

In another aspect, the present disclosure provides a dynamic random access memory device, which includes a substrate, a plurality of dynamic random access memories, and a heat dissipation module. The substrate has a plurality of conductive structures on one side thereof, and the conductive structures are configured for being inserted into a slot of a motherboard. The dynamic random access memories are fixedly disposed on the substrate. The heat dissipation module includes a main body, a fan, and an electrical connection component. The main body is fixedly disposed on the substrate and includes at least one receiving through-hole, a plurality of guide through-holes, and a plurality of exhaust through-holes. The at least one receiving through-hole penetrates through the main body and is located on one side of the main body. Each of the guide through-holes penetrates through the main body, the guide through-holes are disposed adjacent to the at least one receiving through-holes, and the guide through-holes are disposed on one side surface of the main body. The exhaust through-holes penetrate through the main body and are located on a narrow side of the main body, and the exhaust through-holes are disposed on a long lateral side of the main body away from the conductive structures. The fan is fixedly disposed on the main body and correspondingly located in the at least one receiving through-hole. The fan is configured to allow air outside the substrate to enter the substrate through the at least one receiving through-hole and the guide through-holes, and the air entering the substrate through the at least one receiving through-hole and the guide through-holes is discharged outwardly through the exhaust through-holes. The electrical connection component is electrically connected to the fan. The electrical connection component is electrically connected to an external power supply module, so that the external power supply module supplies power to the fan.

In conclusion, thermal shutdown during operation of the DDR5 can be greatly reduced when the heat dissipation module and the dynamic random access memory device provided by the present disclosure are applied to the DDR5 memory module.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
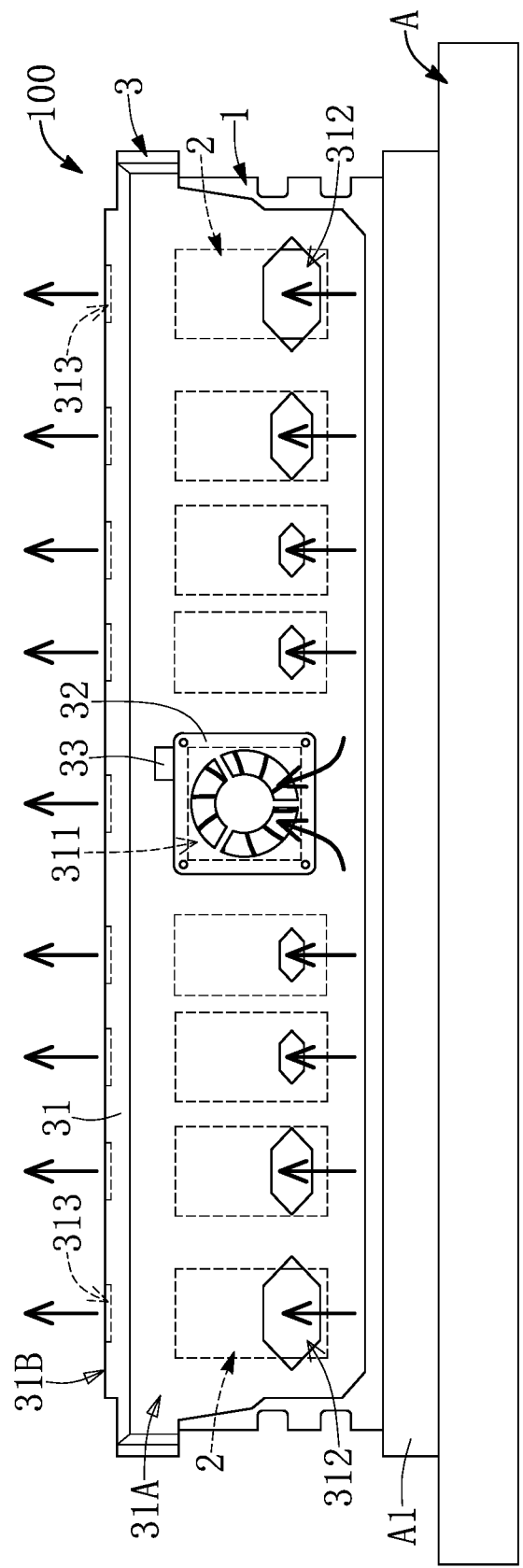
FIG. 1 is a schematic view of a dynamic random access memory device according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

In the description below, if it is indicated that "reference is made to a specific figure" or "as shown in a specific figure", this is only to emphasize that in the description that follows, most content related thereto is depicted in said specific figure. However, the description that follows should not be construed as being limited to said specific figure only.

Figure 2:
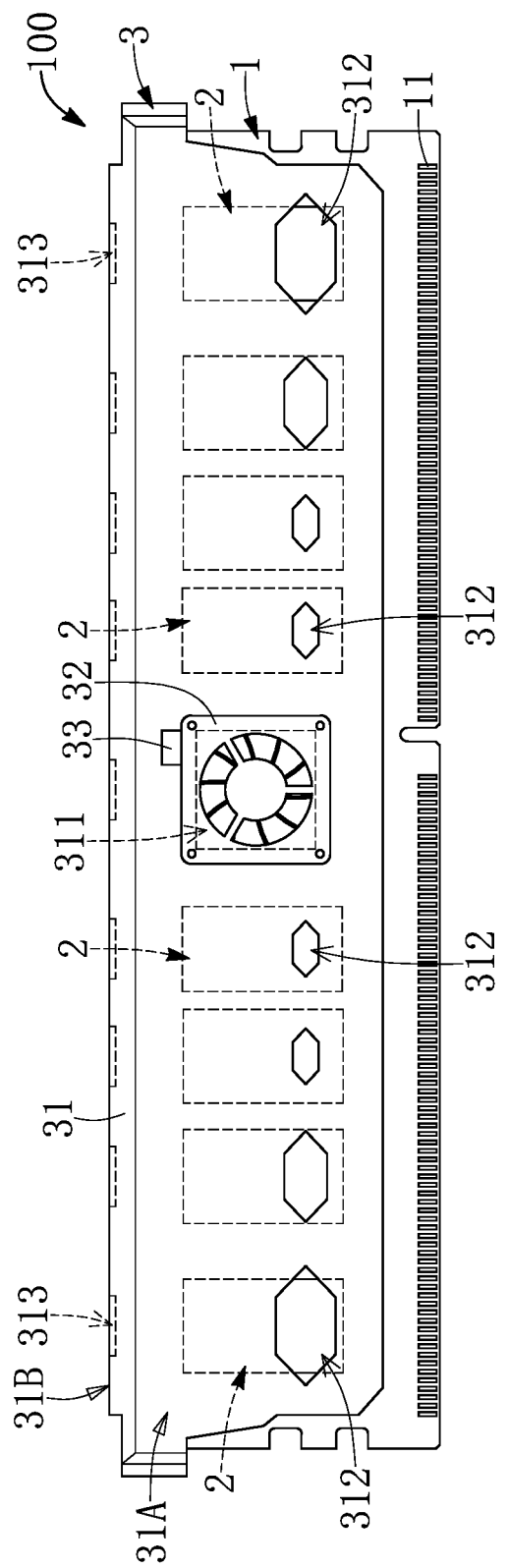
FIG. 2 is a schematic view of a heat dissipation module being assembled to a substrate according to a first embodiment of the present disclosure.
Figure 3:
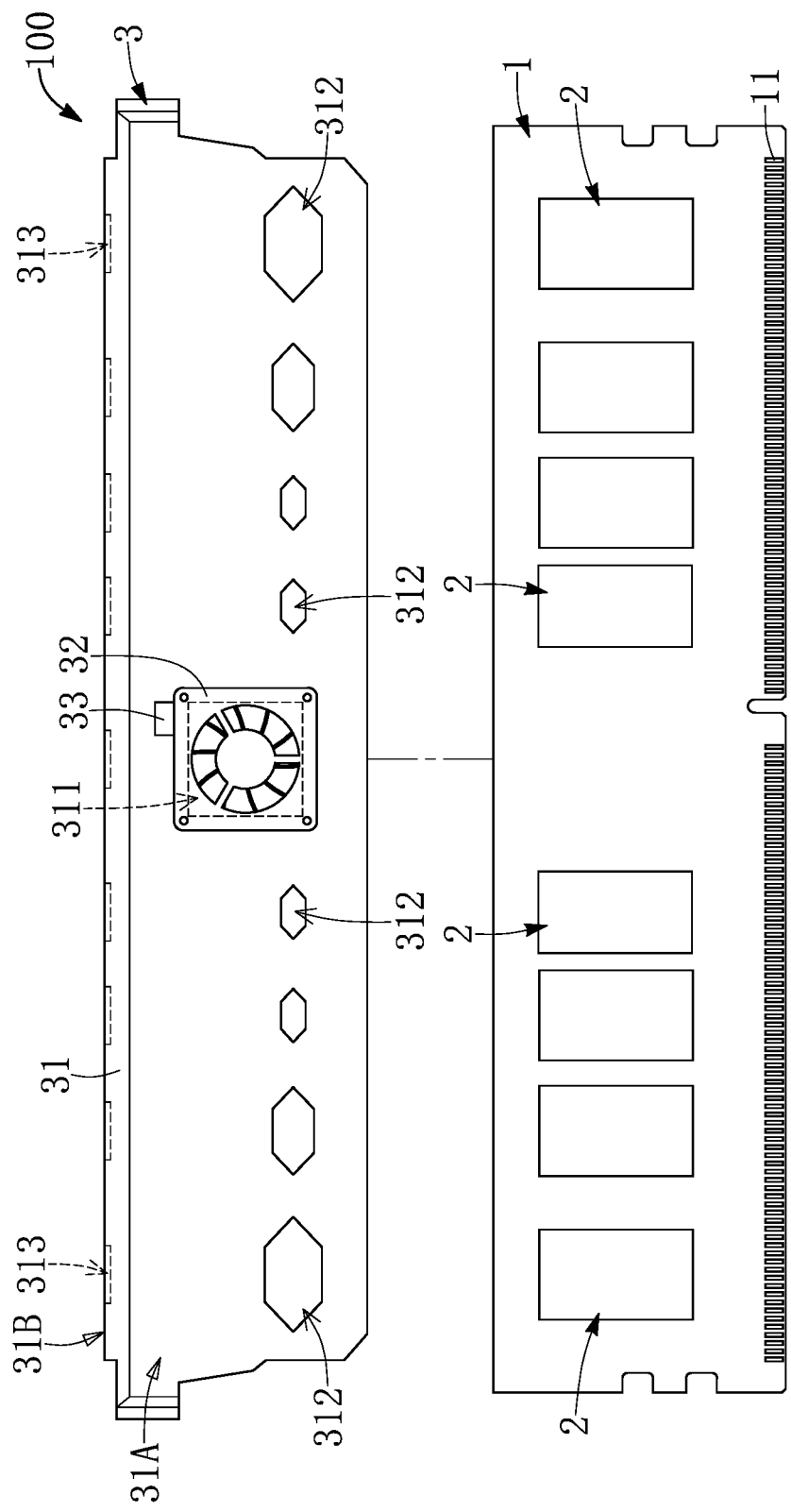
FIG. 3 is a schematic exploded view of the heat dissipation module and the substrate including a plurality of dynamic random access memories according to the first embodiment of the present disclosure.

Reference is made to FIG. 1 to FIG. 3. FIG. 1 is a schematic view of a dynamic random access memory device 100 according to the present disclosure, FIG. 2 is a schematic view of a heat dissipation module 3 being assembled to a substrate 1 according to a first embodiment of the present disclosure, and FIG. 3 is a schematic exploded view of the heat dissipation module 3 and the substrate 1 including a plurality of dynamic random access memories 2 according to the first embodiment of the present disclosure.

The dynamic random access memory device 100 of the present disclosure includes the substrate 1, the plurality of dynamic random access memories (double data rate synchronous dynamic random-access memory, DDR SDRAM) 2, and the heat dissipation module 3. One side of the substrate 1 has a plurality of conductive structures 11, and the conductive structures 11 are configured for being inserted into a slot μl of a motherboard A. The motherboard A mentioned herein is not limited to the motherboard of a computer. In different embodiments, the motherboard A can also be the motherboard in a server.

The dynamic random access memories 2 are fixedly disposed in the substrate 1. In practical applications, the substrate 1 includes related control circuits and a controller 33 for controlling the dynamic random access memories 2, which can be changed according to requirements and are not limited thereto. There are no restrictions on quantities and types of the dynamic random access memories 2 herein. Preferably, each of the dynamic random access memories 2 included in the dynamic random access memory device 100 of the present disclosure is a DDR5 memory.

The heat dissipation module 3 includes a main body 31, a fan 32, and an electrical connection component (not shown in the figures). The main body 31 is fixedly disposed on the substrate 1. The main body 31 includes a receiving through-hole 311, eight guide through-holes 312, and eight exhaust through-holes 313. Quantities of the receiving through-hole 311, the guide through-holes 312, and the exhaust through-holes 313 are not limited to those shown in the figures, and can be changed according to a size of the main body 31 and a size of the substrate 1. An appearance of each of the receiving through-holes 311 can be changed according to an appearance of the fan 32. Sizes and appearances of each of the receiving through-holes 311 and the exhaust through-holes 313 are not limited to those shown in the figures and can be changed according to requirements. In practical applications, the main body 31 can be, for example, made of metal, but is not limited thereto.

Each of the receiving through-holes 311 penetrates through the main body 31 and is located on one side 31A of the main body 31. Each of the guide through-holes 312 penetrates through the main body 31. The guide through-holes 312 are disposed adjacent to the receiving through-holes 311. The guide through-holes 312 are disposed on one side surface of the main body 31. A quantity, a shape, and a position of the guide through-holes 312 can be designed according to requirements. Those shown in the figures are merely exemplary configurations, and an actual application is not limited thereto.

In an exemplary embodiment, the receiving through-holes 311 and the guide through-holes 312 can be disposed on the same one side 31A of the main body 31. The receiving through-holes 311 can be located approximately at a center of the one side 31A of the main body 31, the guide through-holes 312 are located on two sides of the receiving through-holes 311, and the guide through-holes 312 are disposed adjacent to the main body 31 and opposite to a long lateral side where the exhaust through-holes 313 are disposed. In addition, each of the guide through-holes 312 allows a portion of at least one of the dynamic random access memories 2 to be exposed from the main body 31.

The exhaust through-holes 313 penetrate through the main body 31 and are located on a narrow side 31B of the main body 31, and the exhaust through-holes 313 are disposed on the long lateral side of the main body 31 away from the conductive structures 11. In an exemplary embodiment, each of the exhaust through-holes 313 can roughly correspond to one of the dynamic random access memories 2. An appearance and a quantity of the exhaust through-holes 313 are not limited to those shown in the figures, and can be changed according to requirements.

The fan 32 is fixedly disposed on the main body 31 and correspondingly located in the receiving through-hole 311. The electrical connection component is electrically connected to the fan 32. The electrical connection component can be electrically connected to an external power supply module, so that the external power supply module supplies power to the fan 32. More specifically, the electrical connection component can include a plurality of wires and a plug. Two ends of each of the wires are respectively connected to the fan 32 and the plug, and the plug can be inserted into a corresponding socket on the substrate 1 or the motherboard A according to requirements. Therefore, the external power supply module that is connected to the substrate 1 or the motherboard A can supply power to the fan 32 through the electrical connection component and the substrate 1 or the motherboard A.

When the fan 32 is in operation, the fan 32 can suck in air with a relatively low temperature outside of the substrate 1, and the air outside of the substrate 1 can enter between the substrate 1 and the main body 31 through the receiving through-hole 311 and the guide through-holes 312. The air entering the substrate 1 through the receiving through-hole 311 and the guide through-holes 312 can absorb heat that is generated by the dynamic random access memories 2 during operation, and the air can then be discharged outwardly through the exhaust through-holes 313. In this way, an effect of reducing a temperature of the dynamic random access memories 2 during operation can be achieved, thereby greatly reducing a probability of thermal shutdown of the dynamic random access memory device 100 during operation.

It is worth mentioning that, in one of the exemplary embodiments, four of the guide through-holes 312 can be arranged in a row on one side of the receiving through-hole 311, and the other four guide through-holes 312 can be arranged in a row on another side of the receiving through-hole 311. Sizes of the guide through-holes 312 located in the same row are different from each other, the sizes of the guide through-holes 312 decrease when arranged closer to the receiving through-hole 311, and the sizes of the guide through-holes 312 increase when arranged farther away from the receiving through-hole 311. Through a design in which the sizes of the guide through-holes 312 decrease when arranged closer to the fan 32, and the sizes of the guide through-holes 312 increase when arranged farther away from the fan 32, the air outside the substrate 1 can enter between the substrate 1 and the main body 31 with better fluidity, so that the heat generated by the dynamic random access memories 2 during operation can be discharged outwardly in a more effective manner.

In practical applications, the heat dissipation module 3 further includes the controller 33. The controller 33 is electrically connected to the fan 32, and is configured to control a start operation, a stop operation, and a rotation speed of the fan 32. The controller 33 and the electrical connection component are connected to each other. The controller 33 is electrically connected to the external power supply module through the electrical connection component, and the external power supply module provides the power required by the controller 33. The controller 33 can be any microprocessor. For example, the controller 33 can be integrated with the fan 32 into a module, but is not limited thereto.

In specific embodiments, the controller 33 can be electrically connected to a processor disposed on the substrate 1 or the motherboard A through the electrical connection component, and the processor disposed on the substrate 1 or the motherboard A can control the operation of the fan 33 through the controller 33.

In different embodiments, the controller 33 can also control a rotation of the fan 32, or the controller 33 can cooperate with related components to detect a current operating speed and rotation information of the fan 32 in real time. The controller 33 can control the fan 32 to perform related operations based on the current related information that the controller 33 collects about the fan 32.

In an exemplary embodiment, the dynamic random access memory device 100 can further include at least one temperature detector (not shown in the figures), which is disposed on the substrate 1 or the main body 31. Further, the temperature detector can be located between the substrate 1 and the main body 31. The temperature detector is configured to detect a temperature of the dynamic random access memories 2 disposed on the substrate 1 during operation, the controller 33 is electrically connected to the temperature detector, and the controller 33 can receive temperature information transmitted by the temperature detector in real time. When the controller 33 receives the temperature information transmitted by the temperature detector, the controller 33 can analyze the temperature information and determine whether or not a current temperature of the fan 32 exceeds a preset temperature. If the controller 33 determines that the current temperature of the fan 32 exceeds the preset temperature, the controller 33 can control the fan 32 to be turned on, or control the fan 32 to accelerate even more.

Figure 4:
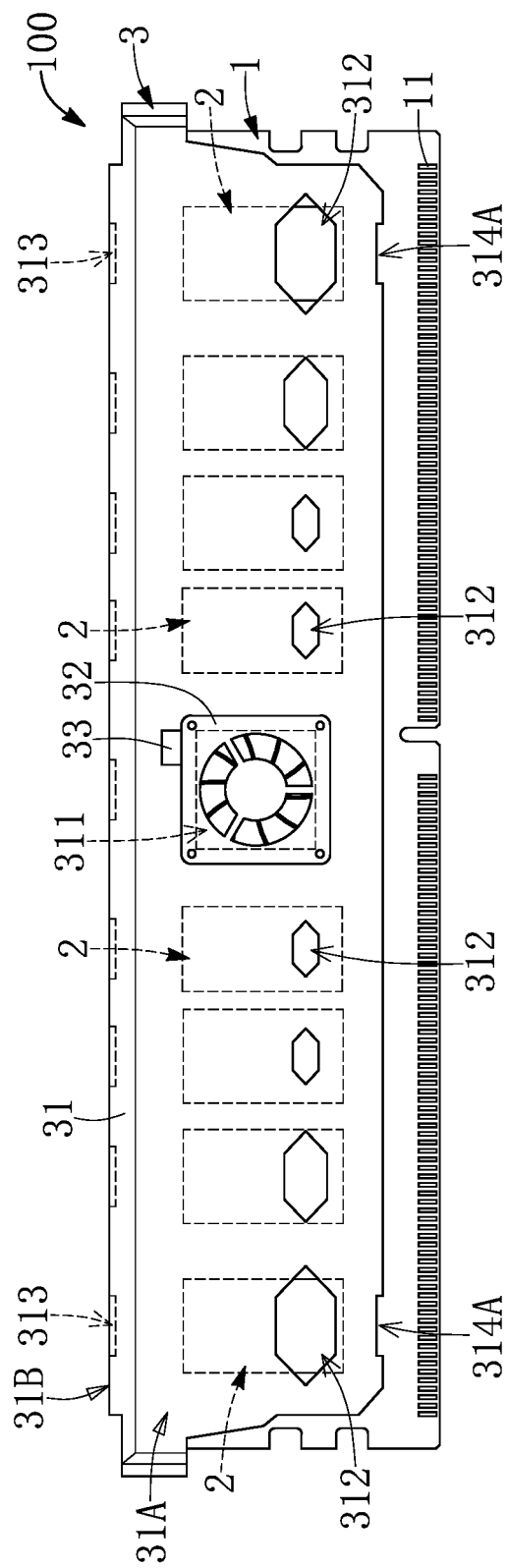
FIG. 4 is a schematic view of the heat dissipation module being assembled to the substrate according to a second embodiment of the present disclosure.

Reference is made to FIG. 4, which is a schematic view of the heat dissipation module being assembled to the substrate according to a second embodiment of the present disclosure. The biggest difference between this embodiment and the previous embodiments is that the main body 31 further includes two guide structures 314A, and the two guide structures 314A are located on another long lateral side opposite to the long lateral side where the exhaust through-holes 313 are disposed (that is, the two guide structures 314A are disposed adjacent to the conductive structures 11 of the substrate 1).

In one of the specific embodiments, each of the guide structures 314A can be a gap formed on a side of the main body 31. When the fan 32 is in operation, the air outside the substrate 1 can pass through the gap (the guide structures 314A) and enter between the substrate 1 and the main body 31 in a relatively easy manner, so that a speed at which the heat dissipation module 3 reduces the temperature of the dynamic random access memory 2 during operation can be increased.

Figure 5:
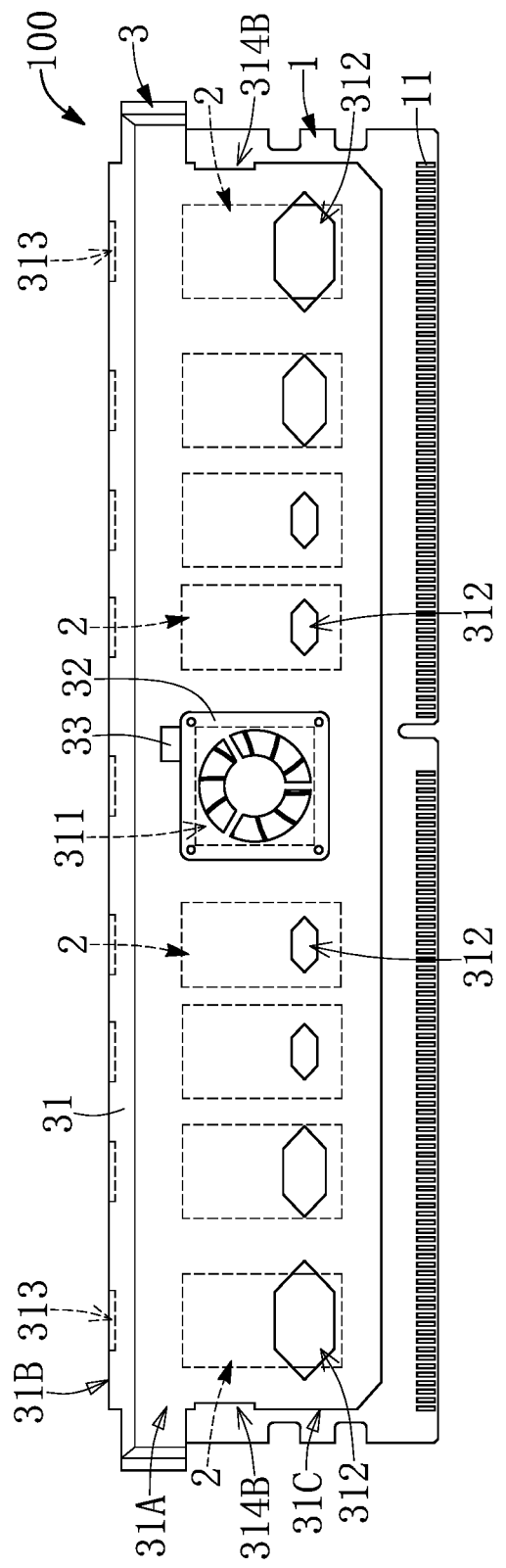
FIG. 5 is a schematic view of the heat dissipation module being assembled to the substrate according to a third embodiment of the present disclosure.

Reference is made to FIG. 5, which is a schematic view of the heat dissipation module being assembled to the substrate according to a third embodiment of the present disclosure. The biggest difference between this embodiment and the embodiment shown in FIG. 4 is that, two guide structures 314B are formed on the main body 31, and the two guide structures 314B are located on two short sides 31C of the main body 31 that are opposite to each other. Similar to the previous embodiment, when the fan 32 is in operation, the air outside the substrate 1 can pass through the two guide structures 314B and enter between the substrate 1 and the main body 31 in a relatively easy manner.

It should be emphasized that, a quantity, an appearance, and a position of where the guide structures 314A, 314B are disposed on the main body 31 mentioned in the present embodiment and the previous embodiments are not limited to those shown in the figures. Any structure that allows external air to easily enter between the main body 31 and the substrate 1 during the operation of the fan falls within the scope of implementation of the guide structures 314A and 314B in the present embodiment and the previous embodiments.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heat dissipation module, comprising: a main body fixedly disposed on a substrate of a memory component, the substrate including a plurality of dynamic random access memories, wherein the main body includes: at least one receiving through-hole penetrating through the main body, the at least one receiving through-hole being located on one side of the main body; a plurality of guide through-holes, each of the plurality of guide through-holes penetrating through the main body, the plurality of guide through-holes being disposed adjacent to the at least one receiving through-hole, and the plurality of guide through-holes being disposed on one side surface of the main body; and a plurality of exhaust through-holes penetrating through the main body, the plurality of exhaust through-holes being located on a narrow side of the main body; a fan fixedly disposed on the main body and correspondingly located in the at least one receiving through-hole, wherein the fan is configured to allow air outside the substrate to enter the substrate through the at least one receiving through-hole and the plurality of guide through-holes, and the air entering the substrate through the at least one receiving through-hole and the plurality of guide through-holes is discharged outwardly through the plurality of exhaust through-holes; and an electrical connection component electrically connected to the fan, wherein the electrical connection component is electrically connected to an external power supply module, so that the external power supply module supplies power to the fan; wherein the at least one receiving through-hole and the plurality of guide through-holes are located on a same side of the main body, and the at least one receiving through-hole is located at a center of the one side of the main body, and wherein the plurality of guide through-holes are located on two sides of the at least one receiving through-hole, and the plurality of guide through-holes are disposed adjacent to the main body and opposite to a long lateral side where the plurality of exhaust through-holes are disposed; and wherein a portion of the plurality of guide through-holes are arranged in a row on one side of the at least one receiving through-hole, and sizes of the plurality of guide through-holes in the same row are different from each other, and wherein the sizes of the plurality of guide through-holes decrease when arranged closer to the at least one receiving through-hole, and the sizes of the plurality of guide through-holes increase when arranged farther away from the at least one receiving through-hole.

2. The heat dissipation module according to claim 1, further comprising a controller electrically connected to the fan, the controller being configured to control a start operation, a stop operation, and a rotation speed of the fan, and the controller and the electrical connection component being connected to each other, wherein the controller is electrically connected to the external power supply module through the electrical connection component, and the external power supply module provides the power required by the controller during operation.

3. The heat dissipation module according to claim 1, wherein the main body further includes a plurality of guide structures, the plurality of guide structures are disposed on another long lateral side of the main body opposite to the long lateral side where the plurality of exhaust through-holes are disposed, or the plurality of guide structures are located on two short sides of the main body that are opposite to each other; wherein the fan is configured to allow the air outside the substrate to enter the substrate by being guided by the plurality of guide structures.

4. A dynamic random access memory device, comprising: a substrate having a plurality of conductive structures on one side thereof, wherein the plurality of conductive structures are configured for being inserted into a slot of a motherboard; a plurality of dynamic random access memories fixedly disposed on the substrate; and a heat dissipation module, including: a main body fixedly disposed on the substrate, the main body including: at least one receiving through-hole penetrating through the main body, the at least one receiving through-hole being located on one side of the main body; a plurality of guide through-holes, each of the plurality of guide through-holes penetrating through the main body, the plurality of guide through-holes being disposed adjacent to the at least one receiving through-hole, and the plurality of guide through-holes being disposed on one side surface of the main body; and a plurality of exhaust through-holes penetrating through the main body, the plurality of exhaust through-holes being located on a narrow side of the main body, and the plurality of exhaust through-holes being disposed on a long lateral side of the main body away from the plurality of conductive structures; a fan fixedly disposed on the main body and correspondingly located in the at least one receiving through-hole, wherein the fan is configured to allow air outside the substrate to enter the substrate through the at least one receiving through-hole and the plurality of guide through-holes, and the air entering the substrate through the at least one receiving through-hole and the plurality of guide through-holes is discharged outwardly through the plurality of exhaust through-holes; and an electrical connection component electrically connected to the fan, wherein the electrical connection component is electrically connected to an external power supply module, so that the external power supply module supplies power to the fan; wherein the at least one receiving through-hole and the plurality of guide through-holes are formed on a same side of the main body, and the at least one receiving through-hole is located at a center of the one side of the main body, and wherein the plurality of guide through-holes are located on two sides of the at least one receiving through-hole, and the plurality of guide through-holes are disposed adjacent to the main body and opposite to the long lateral side where the plurality of exhaust through-holes are disposed; and wherein a portion of the plurality of guide through-holes are arranged in a row on one side of the at least one receiving through-hole, and sizes of the plurality of guide through-holes in the same row are different from each other; wherein the sizes of the plurality of guide through-holes decrease when arranged closer to the at least one receiving through-hole, the sizes of the plurality of guide through-holes increase when arranged farther away from the at least one receiving through-hole, and each of the guide through-holes allows at least one of the dynamic random access memories to be exposed from the main body.

5. The dynamic random access memory device according to claim 4, wherein the heat dissipation module further includes a controller electrically connected to the fan, the controller is configured to control a start operation, a stop operation, and a rotation speed of the fan, and the controller and the electrical connection component are connected to each other, and wherein the controller is electrically connected to the external power supply module through the electrical connection component, and the external power supply module provides the power required by the controller during operation.

6. The dynamic random access memory device according to claim 4, wherein the main body further includes a plurality of guide structures, the plurality of guide structures are disposed on another long lateral side of the main body opposite to the long lateral side where the plurality of exhaust through-holes are disposed, or the plurality of guide structures are located on two short sides of the main body that are opposite to each other; wherein the fan is configured to allow the air outside the substrate to enter the substrate by being guided by the plurality of guide structures.

* * * * *